(12) United States Patent
Miyaki et al.

(10) Patent No.: US 7,176,056 B2
(45) Date of Patent: Feb. 13, 2007

(54) SEMICONDUCTOR INTEGRATED CIRCUIT DEVICE AND METHOD OF MANUFACTURING THE SAME

(75) Inventors: Yoshinori Miyaki, Tachikawa (JP); Hiromichi Suzuki, Tokyo (JP); Tsuyoshi Kaneda, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 51 days.

(21) Appl. No.: 10/295,908

(22) Filed: Nov. 18, 2002

(65) Prior Publication Data

US 2003/0067067 A1 Apr. 10, 2003

Related U.S. Application Data

(60) Division of application No. 09/851,108, filed on May 9, 2001, now abandoned, which is a continuation of application No. 09/785,452, filed on Feb. 20, 2001, now Pat. No. 6,891,253.

(30) Foreign Application Priority Data

Feb. 18, 2000 (JP) ............................. 2000-046724

(51) Int. Cl.
H01L 21/48 (2006.01)
H01L 21/44 (2006.01)

(52) U.S. Cl. ............... 438/106; 438/123; 438/118; 438/617; 257/666; 257/673; 257/E21.641

(58) Field of Classification Search ........... 438/106, 438/123, 118, 617; 257/782, 666, 676, 673, 257/784, 775, E21.641
See application file for complete search history.

(56) References Cited

U.S. PATENT DOCUMENTS 4,080,485 A * 3/1978 Bonkohara .............. 428/620

5,349,238 A 9/1994 Ohsawa et al. .......... 257/736

(Continued)

FOREIGN PATENT DOCUMENTS

EP 0 967 649 A2 12/1999

(Continued)

OTHER PUBLICATIONS

Claims 1 and 2 filed Jul. 14, 2004 in a Divisional application of the above-identified application.

(Continued)

*Primary Examiner*—Kenneth Parker
*Assistant Examiner*—Joseph Nguyen
(74) *Attorney, Agent, or Firm*—Antonelli, Terry, Stout and Kraus, LLP.

(57) ABSTRACT

Arrangements are provided to effectively prevent wire disconnection generated due to an increase of heat applied to a semiconductor integrated circuit device The semiconductor integrated circuit device is structured such that a metal layer containing a Pd layer is provided in a portion to which a connecting member having a conductivity is connected, and an alloy layer having a melting point higher than that of an Sn—Pb eutectic solder and containing no Pb as a main composing metal is provided outside a portion molded by a resin. Further, a metal layer in which a thickness in a portion to which the connecting member having the conductivity is adhered is equal to or more than 10 μm is provided in the connecting member.

9 Claims, 14 Drawing Sheets

U.S. PATENT DOCUMENTS

| | | | |
|---|---|---|---|
| 5,455,195 A | 10/1995 | Ramsey et al. | |
| 5,521,432 A | 5/1996 | Tsuji et al. | |
| 5,635,755 A | 6/1997 | Kinghorn | 257/666 |
| 5,650,661 A | 7/1997 | Mathew | 257/677 |
| 5,801,436 A | 9/1998 | Serizawa | |
| 5,818,699 A | 10/1998 | Fukuoka | 361/760 |
| 5,889,317 A * | 3/1999 | Huang et al. | 257/666 |
| 5,902,472 A * | 5/1999 | Arai et al. | 205/125 |
| 5,920,115 A | 7/1999 | Kimura et al. | 257/668 |
| 5,929,511 A | 7/1999 | Nakazawa et al. | |
| 5,994,767 A | 11/1999 | Huang et al. | |
| 6,034,422 A | 3/2000 | Horita et al. | |
| 6,037,653 A | 3/2000 | Kim et al. | |
| 6,057,595 A | 5/2000 | Pohl et al. | 257/696 |
| 6,087,714 A | 7/2000 | Kubara et al. | |
| 6,104,091 A | 8/2000 | Ito et al. | 257/738 |
| 6,139,977 A | 10/2000 | Abys et al. | |
| 6,172,422 B1 | 1/2001 | Chigawa et al. | 257/778 |
| 6,265,762 B1 * | 7/2001 | Tanaka et al. | 257/676 |
| 6,268,646 B1 * | 7/2001 | Sugimoto et al. | 257/673 |
| 6,271,601 B1 * | 8/2001 | Yamamoto et al. | 257/784 |
| 6,292,083 B1 * | 9/2001 | Tajima et al. | 336/192 |
| 6,372,625 B1 | 4/2002 | Shigeno et al. | 438/617 |
| 6,395,583 B1 | 5/2002 | Kubura et al. | 438/123 |
| 6,608,369 B2 * | 8/2003 | Sone | 257/676 |

FOREIGN PATENT DOCUMENTS

| | | | |
|---|---|---|---|
| JP | 61-140160 | | 6/1986 |
| JP | 10-326859 | | 8/1998 |
| JP | 11-145369 | * | 5/1999 |
| JP | 11-168169 | | 6/1999 |
| JP | 11-224929 | | 8/1999 |
| JP | 11-307710 | | 11/1999 |

OTHER PUBLICATIONS

U.S. Office Action dated Jun. 27, 2006 (U.S. Appl. No. 11/362,732).

* cited by examiner

SEMICONDUCTOR INTEGRATED CIRCUIT DEVICE AND METHOD OF MANUFACTURING THE SAME

This is a divisional of application Ser. No. 09/851,108, filed May 9, 2001; now abandoned, which is a continuation of Ser. No. 09/785,452, filed Feb. 20, 2001, now U.S Pat. No. 6,891,253, the entire disclosures of which are hereby incorporated by reference.

BACKGROUND OF THE INVENTION

1. Field of the Invention

The present invention relates to a semiconductor integrated circuit device, and more particularly to a technique which is effective to prevent a wire from being broken.

2. Description of the Prior Art

In a conventional process of assembling a semiconductor integrated circuit, the following steps have been performed. That is, in an Ag spot plating step, an Ag spot plating is applied to a front end portion (including portions obtained by wire bonding a chip and a lead frame by an Au wire) of a lead of a pressed or etched lead frame (hereinafter referred to as an inner lead) molded by a mold. Next, in a step of assembling a package, a die bonding, a wire bonding and an assembly of the package to be molded are performed In a subsequent outer plating step (including a dipping step), in order to mount to a printed circuit board or a circuit board, a Sn—Pb system solder layer is previously attached to a portion including a contact portion between a lead which is not molded by the mold (hereinafter referred to as an outer lead) and the substrate in accordance with an outer plating. After the Ag spot plating step and the outer plating step mentioned above are finished, the process goes to a step of working a product.

However, in recent years, when a countermeasure to an environmental problem is required, in particular, as is indicated in Japanese Unexamined Patent Publication No. 5-270860 (U.S. Pat. No. 5,633,090) or the like with respect to Pb, it is required to reduce Pb to a level suitable to serve as a countermeasure against environmental problems, even in a general electronic, part such as a semiconductor integrated circuit device or the like and a mounting board.

Conventionally, in order to reduce Pb, the countermeasure is performed by replacing the Sn—Pb solder employed in the outer plating step by the another solder (alloy) which does not contain Pb as a main metal, that is, a Pb-free alternate solder (a solder composed of a Pb-free metal) The Pb-free alternate solder is required to have a range of melting temperature similar to that of Sn—Pb and an excellent bonding property, particularly a wetting property. No composition completely satisfying the requirements presently exists, and the solders are selectively used in correspondence with members such as printed circuit boards, the chip part, semiconductor packages and the like. Accordingly, various compositions have been proposed in a Sn-base alloy in correspondence with various usages, for example, an invention in which a Sn—Bi system is employed in place of the Sn—Pb system for the metal employed for the solder layer attached to and formed in the conventional lead, in Japanese Unexamined Patent Publication No. 10-93004 (prior art 1). Further, with respect to the structure of the metal composition of the solder, an invention is proposed in which the package outer lead and the substrate are mounted by using a Sn—Ag—Bi system solder, in Japanese Unexamined Patent Publication No. 11-179586 (WO 99 30866) (prior art 2).

In the case of employing a Sn—Pb eutectic alternate Pb-free solder for the outer plating, the Sn-base alloy is selected at every usage in the same manner as that mentioned in the prior art. However, in particular, in parts mounted on the vehicle, significantly developed mobile electronic devices and parts with high reliability, an alloy excellent in a bonding strength and possessing a heat resisting fatigue property is desired. A Sn—Ag system alloy is known as a Sn-base alloy in the case of attaching great importance to an excellent bonding strength, an excellent heat resisting fatigue property, and a high reliability. The melting point of the Sn—Pb eutectic solder is generally 183° C. On the contrary, the melting point of most of the Sn—Ag system alloy is 200° C. or more, and, as such, is higher than the melting point of the Sn—Pb eutectic solder. Accordingly, it is unavoidable that the reflow temperature at a time of mounting the semiconductor integrated circuit using the Sn—Pb eutectic alternate Pb-free solder becomes high in present system. The inventors of the present application mounted the semiconductor integrated circuit device, on which the inner lead is Ag-plated and the outer lead is plated by using the Pb-free alternate solder having a melting point higher than that of the Sn—Pb eutectic solder, at a reflow temperature higher than in the conventional case and evaluated the product. As a result, the inventors ascertain that product inferiority is generated due to the wire disconnection.

SUMMARY OF THE INVENTION

Accordingly, a purpose of the present invention is to provide means for effectively preventing, a wire disconnection generated at a time when a semiconductor integrated circuit device, on which an outer lead is plated by using a Pb-free alternate solder having a melting point higher than that of a Sn—Pb eutectic solder, is mounted at a reflow temperature higher than the conventional one.

Another purpose of the present invention is to provide means for effectively preventing a wire disconnection generated due to an increase of heat generally applied to a semiconductor integrated circuit device in addition to an increase of reflow temperature A brief description will be given of a summary of a representative invention among the inventions disclosed in the present application. Accordingly, a semiconductor integrated circuit device is provided comprising:

a conductive connecting member;

a connected member in which a metal layer, including a palladium layer, is provided at a portion to which the connecting member is connected, and an alloy layer containing no Pb as a main composing metal having a melting point higher than that of a solder having Pb as a main composition metal and containing no Pb as a main composing metal is provided at a portion outside a portion molded by a resin; and a resin for molding the connected portion.

The invention mentioned above employs Pd as a metal provided through means for attaching and forming the portion to which the connecting member is connected in accordance with a plating or the like. Because there is no problem in a bonding property between a wire such as an Au wire or the like corresponding to the connecting member having a conductivity and a frame material corresponding to the connected material such as a Cu alloy and a 42 alloy, there is a reduced disadvantage generated by the recess of a capillary since Pd is a harder metal in comparison with Ag, and there is a reduced dispersion of the thickness of a metal attached to each of the connected members. In this case, a place to be attached and formed is set to the portion to which the connecting member is connected because the place should be restricted to a minimum area as long as no problem is applied to the bonding property with the connecting member, since Pd is not inexpensive with respect to the Sn—Pb system alloy and Ag, and in particular, the cost reduction object can not be effectively achieved in the case of being used for attaching and forming the portion outside the mold body such as the outer lead or the like having a large area.

With respect to a problem such as a plating crack or the like, which may be generated due to a molding process or the like of applying a physical deforming force to the attached and formed portion after attaching and forming, the present invention does not have this problem since the plated portion is molded and is not formed nor worked. Further, there are advantages such that a migration of Ag can be avoided, a virulently poisonous cyanogen is not required at the time of plating, and the like.

Further, the connected member is structured such that the alloy containing no Pb as the main composing metal and having the melting point higher than that of the solder having Pb as the main composing metal is attached to and formed in the portion outside the portion molded by the resin, because it is intended that the materials other than a Cu frame such as a 42Ni—Fe alloy or the like corresponding to the material of the frame corresponding to the connected member can be employed, and it is intended to avoid inherent problems in a whole surface Pd plating such as that a cost reduction can not be achieved in view of a material cost when applying the same Pd plating as that of the front end portion of the inner lead thereto.

Further, the inventors of the present application have found that the technical idea of the present invention is that the Pd plating is applied to the front end portion of the inner lead can be also applied to narrowing the wire together with a chip shrink in view that it is possible to reduce a dispersion of the plating thickness and increase the bonding strength.

Accordingly, a brief description will be given of a summary of another representative invention among the inventions disclosed in the present application. Accordingly, a semiconductor integrated circuit device is provided comprising:

a wire having a diameter equal to or less than 30 μm;

a connected member in which a metal layer including a palladium layer is provided at the portion to which the wire is connected, and a solder containing Pb as a main composition metal is provided at a portion outside the portion molded by a resin; and a resin for molding the connected portion.

Since the palladium metal layer is attached to and formed on the connecting member, whereby the bonding strength is improved, the structure is effective to improve an assembly yield and the reliability with respect to an increase of the number of pins and an increase of size in the package, and also improving the narrowing of wire (a wire diameter is equal to or less than the present size 30 μm) caused by the chip shrink, even in the present case in which a Pb-free solder is not completely employed. Further, since it is sufficient that the palladium metal layer is attached to and formed on the portion to be connected, the palladium metal layer may be attached to and formed on a tab in addition to the front end portion of the inner lead, in accordance with the relationship between the cost of the attaching and forming step and the cost of the material.

A description will be given in detail of particulars involved in the invention described in the present application.

The inventors of the present application have repeatedly evaluated the problem so as to find the reason by which the wire is disconnected, and have newly defined the reason of generation. As a result of the inventor's analysis, it has been found that an inferiority of lead side disconnection in the wire is considered to be classified into "an inferiority of wire disconnection after molding" and "an inferiority of lead adhered portion disconnection after reflowing". At first, it is considered that the inferiority of wire disconnection after molding is caused by a stress generated due to a vibration of the lead and a stress generated due to a resin hardening and shrinking. As shown in FIG. 1, when charging the resin from a gate 33 (a charging time is 10 seconds), the front end portion of an inner lead 4 is vertically vibrated due to a resin stream. A stress is applied to a wire 19 due to the vibration, and particularly, the vibration stress tends to be applied to a pin near the gate portion. Further, since the resin is hardened and shrunk from a position apart from the gate 33 toward the gate 33 (from right to left in the drawing), it is considered that a tensional force is applied to the wire 19 and the wire disconnection is generated from the lead side adhered portion having a relatively weak bonding strength.

Next, it is considered that the inferiority of lead adhered portion disconnection after reflowing is generated due to a difference between an expansion 36 of the lead frame and an expansion 35 of the resin. FIG. 2 is a schematic view explaining the matter mentioned above. Physical properties of the resin hardened material are largely changed at a glass transition point Tg (150 to 160° C.) of the resin, and particularly, a coefficient of thermal expansion a (=1.4) in an area (a2) equal to or more than Tg becomes about four to five times a value in an area (a1) equal to or less than Tg. Since the temperature at the time of reflowing is higher than the temperature of Tg, damage is applied to the wire 19 due to the resin expansion (a2) at the time of reflowing, a crack 37 is generated at a portion having little strength (an A portion in FIG. 2), and the disconnection is generated due to a difference 34 between the expansion 36 of the lead frame and the expansion 35 of the resin, as shown in FIG. 3.

Since the reflow temperature is increased by using the alternate solder made of the Sn-base alloy having a high melting point for the reason of employing the Pb-free solder, the heat applied to the package is increased, and in particular, the difference between the expansion of the lead frame and the expansion of the resin is promoted. Accordingly, it has been found that the inferiority of disconnection in the lead side adhered portion after reflowing particularly becomes a problem among the inferiority of wire disconnection mentioned above.

In this case, the inventors of the present application have estimated a relationship between the thickness of the Ag plating and the wire disconnection. As a result, it has been clarified that the wire disconnection is easily generated when the thickness of plating is in a predetermined thickness range. Analyzing the reason thereof, it can be considered that an area of connecting surface between Ag and Au cannot be sufficiently secured at the time of adhering the Au wire in a too thin plating thickness, whereby the wire disconnection is generated in accordance with a wire deformation due to a thermal stress. Further, when making the Ag plating thicker than a certain thickness, the Ag plating surface is deformed at a degree equal to or more than necessary so as to absorb a bonding energy. As a result, it is considered that it is impossible to obtain a sufficient bonding, and a cross sectional shape of the bonding surface is formed in a shape that is weak with respect to the tension against the thermal deformation of the Au wire.

Further, a description will be given of an inferiority of disconnection in the lead side adhered portion after reflowing in view of its shape. FIG. 4 is a cross sectional view of a case when the wire 19 is adhered to the Ag spot plating surface by a capillary 20. A hatched portion in FIG. 4 corresponds to a front end of the capillary 20, a diameter of the front end is 170 µm, and a diameter of the Au wire 19 is 30 µm. In the drawing, the thickness of the lead frame 7 is 150 µm. As mentioned above, since the thickness of the Ag plating 38 is dispersed in a range between about 1.5 µm and 10 µm at each of the lead frames to be Ag-plated, it is hard to define the thickness of the Ag plating. Accordingly, in the drawing, it is supposed that the plating thickness at which the inferiority of disconnection is considered to be generated is comparatively thick.

In the case of adhering the wire, since Ag is a relatively soft metal, the capillary 20 sinks into the surface of the Ag plating 38, and a part of the surface of the Ag plating 38 rises up, as shown in FIG. 4. Then, the thickness of the Au wire 19 in a portion denoted by the reference symbol A in FIG. 4 becomes relatively thin, whereby a portion having a weakened wire strength is generated. FIG. 5 is a perspective view of the lead side adhered portion after bonding. In FIG. 5, a portion denoted by a line A corresponds to the A portion in FIG. 4. After reflowing, the wire disconnection is generated from the A portion in FIG. 4, as shown in FIG. 6, due to the difference between the expansion of the lead frame and the expansion of the resin. For reference, FIG. 7 is a perspective view of the lead side adhered portion of the inferiority of wire disconnection after molding. The inferiority of disconnection in the lead side adhered portion after reflowing is generated so that the disconnected wire overlaps with the adhered portion. However, the inferiority of wire disconnection in the lead side adhered portion after molding is generated so that the disconnected wire is apart from the adhered portion. As mentioned above, it is apparent on the basis of the analysis of the inventors of the present application that the wire disconnection is generated by the reason that the capillary 20 sinks into the surface of the Ag plating having a comparatively large thickness, so as to generate the portion having the weakened wire strength.

In recent years, the thickness of the Ag plating required in typical designs has become only a few µm. As a result of estimating the dispersion of the thickness of the surface of the Ag plating, it has been known that in the current Ag plating process, it is hard to maintain an initial set plating thickness at the time of treating numerous subjects to be plated, and the plating thickness is dispersed in a range between 1.5 µm and 10 µm at each of the subjects to be plated. Accordingly, the inventors of the present application have tried to keep the maximum thickness within a range between 5 and 8 µm rather than the conventional 10 µm, in order to restrict the dispersion of the thickness of the Ag plating at each of the lead frames. However, in the current Ag plating process, the maximum thickness 10 µm is a limit as mentioned above, and it has been hard to set the maximum thickness in the range between 5 and 8 µm. Accordingly, it is considered that it is difficult in the current Ag plating process to make the dispersion of the plating thickness smaller than the current level.

Then, in order to solve the problem mentioned above that the portion having the weakened wire strength is generated, the present invention can be achieved by considering a new idea of using a metal that is harder than Ag and which has a little dispersion of thickness for the metal layer attached to and formed in the front end portion of the inner lead, and by estimating and considering so as to employ an appropriate metal for keeping production cost at a minimum.

Next, a description will be given of a reason that the palladium metal layer is attached to and formed in the front end portion of the inner lead, as mentioned above, whereby the disconnection of the lead side adhered portion after reflowing can be prevented, in view of the shape of the lead side adhered portion.

FIG. 8 is a cross sectional view of when the wire 19 is adhered to the surface of the Pd plating 10 by the capillary 20. An embodiment is described in which a hatched portion in FIG. 8 is a front end of the capillary 20, a diameter of the front end is 170 µm, and a diameter of the Au wire 19 is, 30 µm. In the case of adhering the wire 19, since Pd is a relatively hard metal, the capillary 20 does not sink so much in comparison to the case in which the plating surface is Ag. Accordingly, the thickness t of the Au wire 19 in a portion A in FIG. 8 can be secured to a sufficient thickness in comparison with the portion A in FIG. 4, so that it is possible to keep the wire strength. FIG. 9 is a perspective view of the lead side adhered portion after bonding. A portion denoted by a line A in FIG. 9 corresponds to the portion A in FIG. 8. It is known that the thickness of the Au wire in FIG. 9 can be secured in comparison with that in FIG. 5. After reflowing, the stress is applied in the direction of an arrow in FIG. 9, due to the difference between the expansion of the lead frame and the expansion of the resin. However, since there is no portion having weakened strength, the disconnection that would occur so that the disconnected wire overlaps with the adhered portion, which is generated at the Ag plating, is not generated. The wire disconnection is not generated when the adhering force of the capillary 20 is set so as to secure 10 µm or more of the thickness t of the Au wire when the thickness of the lead frame 7 is 150 µm, and the thickness of the Pd plating 10 is 0.02 µm at the minimum and 0.15 µm at the maximum.

Next, a description will be given of the reason why the technical idea of the present invention for attaching and forming the Pd metal layer to the member to be connected can be applied to a technique of narrowing the connecting member without relation to the Pb-free solder.

As a result of estimating the conditions in the representative invention in accordance with the present application, attention is paid to the fact that an estimation is performed on the assumption that the size of the package is not changed. In this case, the wire disconnection is caused by the difference between the expansion of the lead frame and the expansion of the resin, as mentioned above. Accordingly, it is considered that the difference in the expansion mentioned above becomes more significant when the package is enlarged in accordance with the multi pins. Since the capacity is increased, the amount of heat becomes large, so that the heat applied to the resin at a time of reflowing is increased. Further, due to the multi pins, the heat flowing from the substrate through the pin at a time of reflowing is also increased.

Further, even in the case that the pitch is narrowed due to the chip shrinkage, a large amount of heat is applied to the package in comparison with the package which has the same size. Accordingly, the package size becomes small due to the chip shrinkage, even in the package having the same number of pins. The pad pitch of the wire bonding is narrowed in accordance therewith, and the wire diameter becomes small. In accordance with the narrowing of the wire caused by the chip shrink, that is, in case that the current wire diameter 30

μm becomes narrower, it is considered that it is necessary to make the plating thickness thin. Because it is considered that the dispersion of the plating thickness within the range capable of being realized in the current Ag spot plating process is too large in the future the bonding operation will become unstable.

That is, the matter in which the heat applied 25 to the package is increased due to the narrow pitch in accordance with multiple chips and the chip shrinkage, even when the reflow temperature is not changed, corresponds to the matter in which the reflow temperature is increased. Accordingly, the technical idea of attaching and forming the Pd metal layer to the member to be connected can be applied in view of that it is possible to reduce the dispersion of the metal thickness and increase the bonding strength, without direct relation to the Pb-free solder.

In this case, although the technical idea is different from the invention described in the present application, there is a pre-solder plated lead frame(PPL) process as a treating method in which the Pb-free can be realized. The PPL process is a process for plating on the entirety of the lead frame including the die bonding portion, the inner lead and the outer lead before molding, using the palladium metal which has a good bonding property. The PPL process can be made Pb-free since the metal used in the plating is palladium. Further, in the PPL process, since an outer plating process conventionally performed after molding is not required, it is possible to shorten the assembling time and automate the whole assembling process due to the omission of a solder plating in the outer lead.

However, since a local battery is formed in accordance with a potential difference between the material of the frame member and the Pd material, there is a risk that a corrosion could be generated, so that an Fe system frame such as 42 alloy (42Ni—Fe) metal or the like could be used as the frame member, and the frame is then limited to a copper alloy. In this case, the Fe system frame can be used by inserting a barrier metal between the frame and the Pd metal layer. However, since a material in the cross section is exposed at the time of cutting the dam bar and the front end of the lead in an actual assembly process, and the material corrosion is concentrically accelerated from the cross section, and also since this Fe system frame becomes disadvantageous in view of the manufacturing cost due to complexity of the manufacturing process, the result is that this structure is not proper. Further, since the plating of the outer lead is applied from the frame state, there is a high possibility that the outer lead surface will be contaminated and the solder wetting property at the time of mounting the substrate will be deteriorated in a burr removing operation for removing resin burrs or the like. Further, since the palladium is a hard metal in comparison with the lead system solder, the problem occurs that the plating peels if the outer lead is formed after plating.

Accordingly, even if the Pd plating process mentioned above is employed as means for achieving the object of the present invention, that is, preventing the wire disconnection, it is basically possible to reduce the difference of the plating thickness at each of the subjects to be plated. However, since there are the disadvantages mentioned above, it is a matter of course that this process is inadequate to solve the problems at hand.

Further, the inventors of the present application have searched known arts before filing the present application in view of "plating Pd on the lead frame". As a result, in Japanese Unexamined Patent Publication Nos. 11-40723 (U.S. Pat. No. 5,889,317) (a known art 3) and 11-220084 (a known art 4), there is proposed an invention in which a part or a whole of a lead including at least an outer lead is plated by a Pd system metal. Further, as an invention in which an entire lead is plated by a Pd system metal mainly in view of requiring no outer plating process and automating the entire assembly process, Japanese Unexamined Patent Publication Nos. 10-284666 (a prior art 5), 10-298798 (a prior art 6) and 10-18056 (a prior art 7), have been proposed. In view of further applying an Au—Ag alloy plating onto an outermost surface of a Pd system metal layer, Japanese Unexamined Patent Publication No. 11-8341 (a prior art 8) is proposed.

DESCRIPTION OF THE PREFERRED EMBODIMENT

Figure 1:
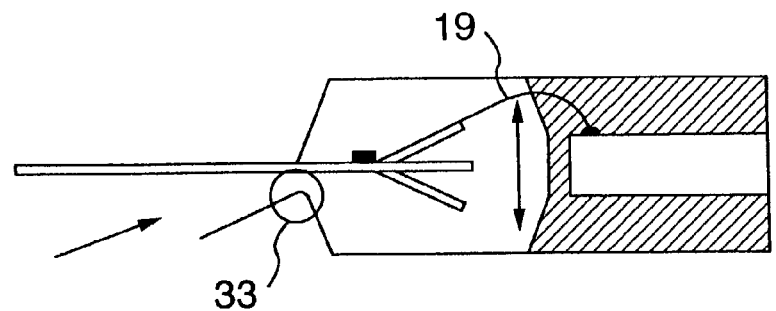
FIG. 1 a schematic view showing a mechanism by which an inferiority of wire connection is generated after molding.
Figure 2:
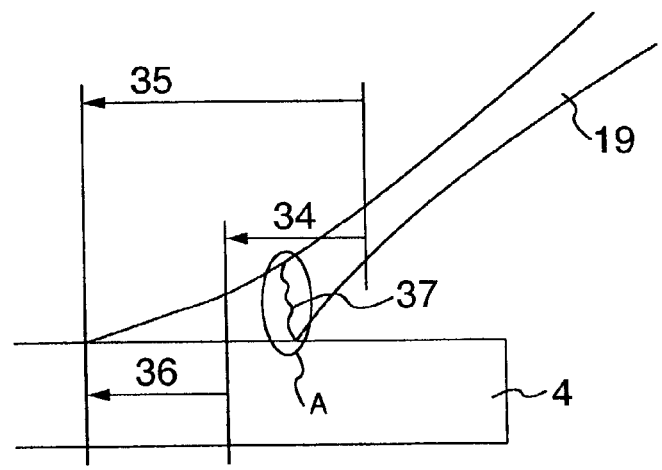
FIG. 2 is a schematic view showing a mechanism by which a crack is generated in a lead side adhered portion after reflowing.
Figure 3:
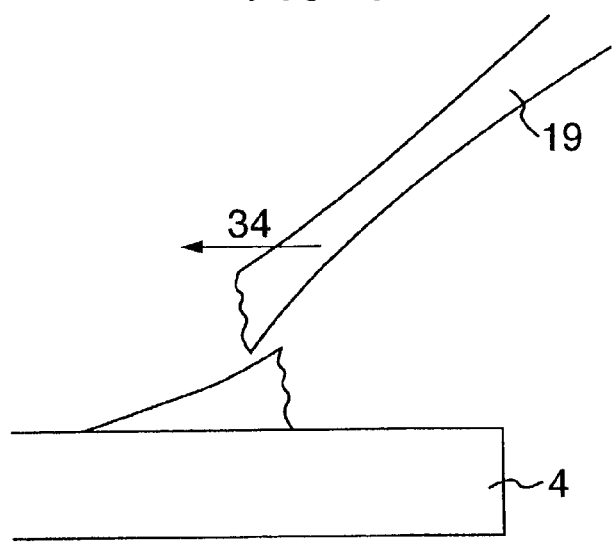
FIG. 3 is a schematic view showing a wire disconnection generated in a lead side adhered portion after reflowing.
Figure 4:
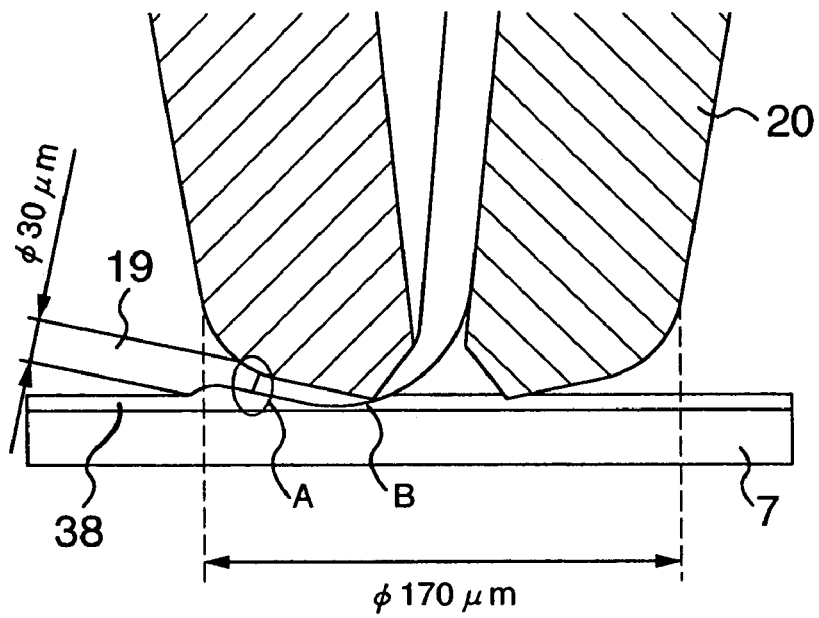
FIG. 4 is an enlarged view of a wire bonding 5 onto the surface of an Ag plating at the time of adhering a wire.
Figure 5:
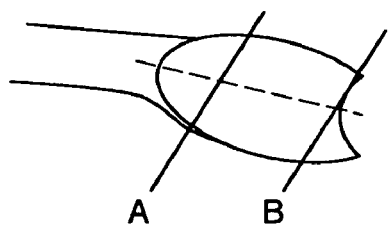
FIG. 5 is a perspective view of a wire adhered portion of the wire bonding onto the surface of the Ag plating.
Figure 6:
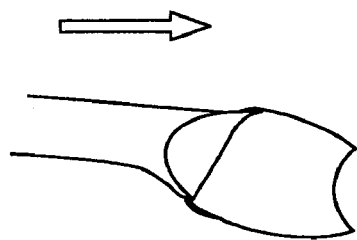
FIG. 6 is a schematic view showing a wire disconnection after reflowing the Ag plating.
Figure 7:
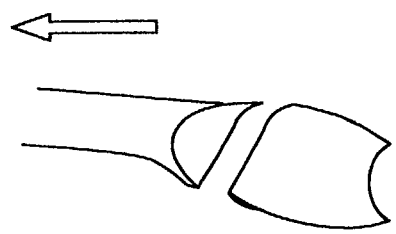
FIG. 7 is a schematic view showing a wire disconnection after a resin of the Ag plating is hardened and shrunk.
Figure 8:
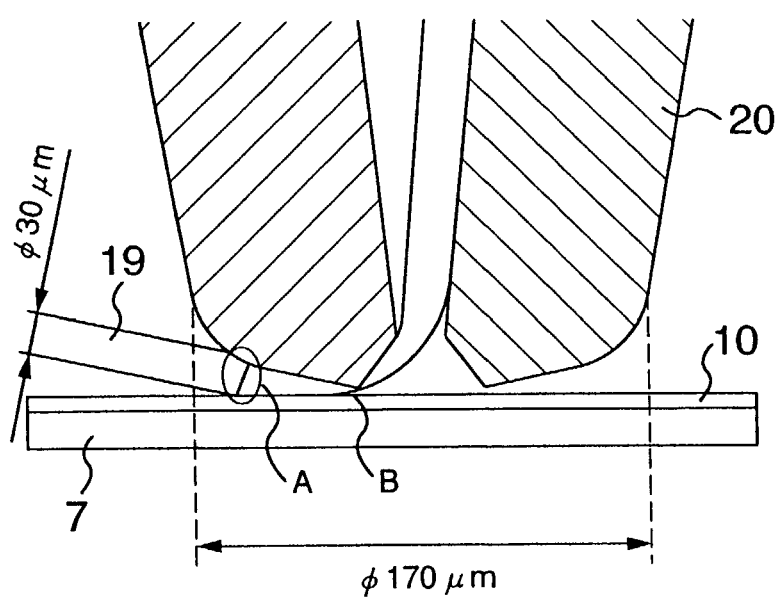
FIG. 8 is an enlarged view of a wire bonding onto the surface of a Pd plating at the time of adhering a wire.
Figure 9:
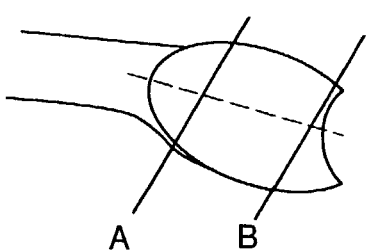
FIG. 9 is a perspective view of a wire adhered portion of the wire bonding onto the surface of 20 the Pd plating.

A description will be given in detail below of an embodiment in accordance with the present invention with reference to the accompanying drawings In this case, the same reference numerals are attached to elements having the same functions in all of the drawings for explaining the embodiment, and an overlapping description will be omitted.

A semiconductor integrated circuit device in accordance with the present embodiment is a semiconductor integrated circuit device in which a front end portion of an inner lead is palladium spot plated and outer lead is Sn—Ag system alloy plated.

In the present embodiment, a structure is exemplified having 208 pins and a package 15 size of 28 mm square.

Figure 10:
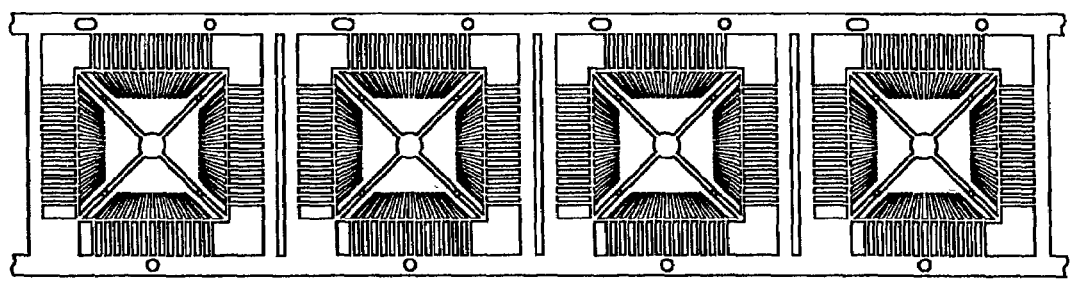
FIG. 10 is a plan view of a lead frame corresponding to one embodiment in accordance with the present invention.

Four repeated units of a lead frame used in the semiconductor integrated circuit device are described in FIG. 10. It is a matter of course that the number of repeated units is not limited to four. Further, the material is a Cu alloy in the present embodiment, however, it may be an iron system lead frame such as 42Ni—Fe or the like. In the present embodiment, since the palladium plating is not applied to the whole surface, the local battery in the outer lead which is a problem in the palladium whole surface plating is not generated.

Figure 11:
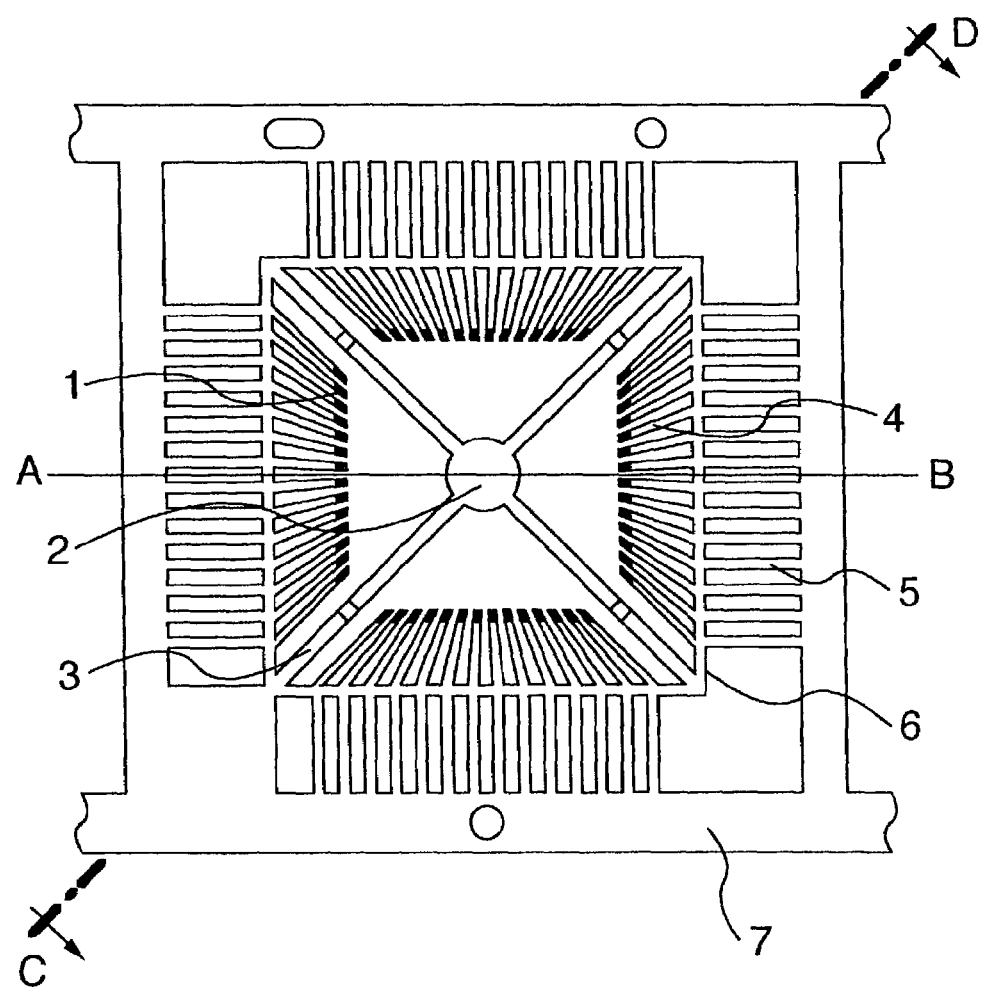
FIG. 11 is an enlarged plan view of a lead frame corresponding to one embodiment in accordance with the present invention.

FIG. 11 is an enlarged view of one lead frame 7 in which a palladium plating 1 is applied to a front end portion of the inner lead 4. A tab (die pad) 2 is a so-called small tab, and the area of a chip mounting surface is set to be smaller than the area of a main surface of a semiconductor chip mounted thereon. By using the small tab, it is possible to prevent the risk of a reflow crack being generated. In accordance with the present embodiment, the tab is a small tab, however, it may be a cross tab type (a type having only a width of a suspending lead 3), and may be also a normal tab. Further, in accordance with the present embodiment, no palladium plating is applied to the die pad 2, however, a palladium plating may be applied to the die pad 2.

Figure 12:
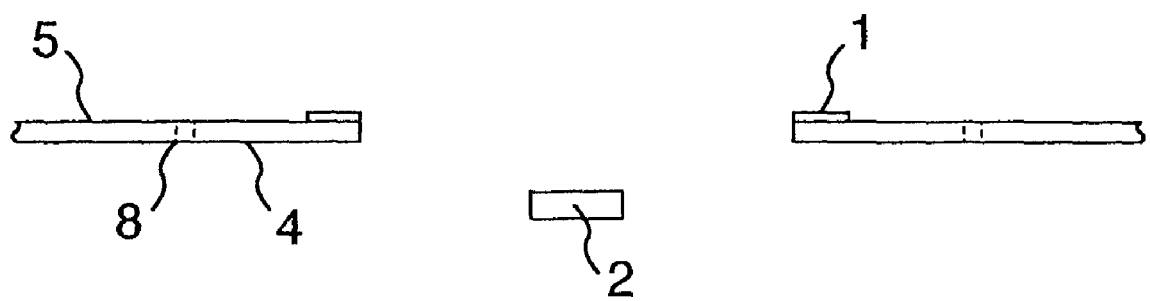
FIG. 12 is a cross sectional view along a line A-B in FIG. 11.
Figure 19:
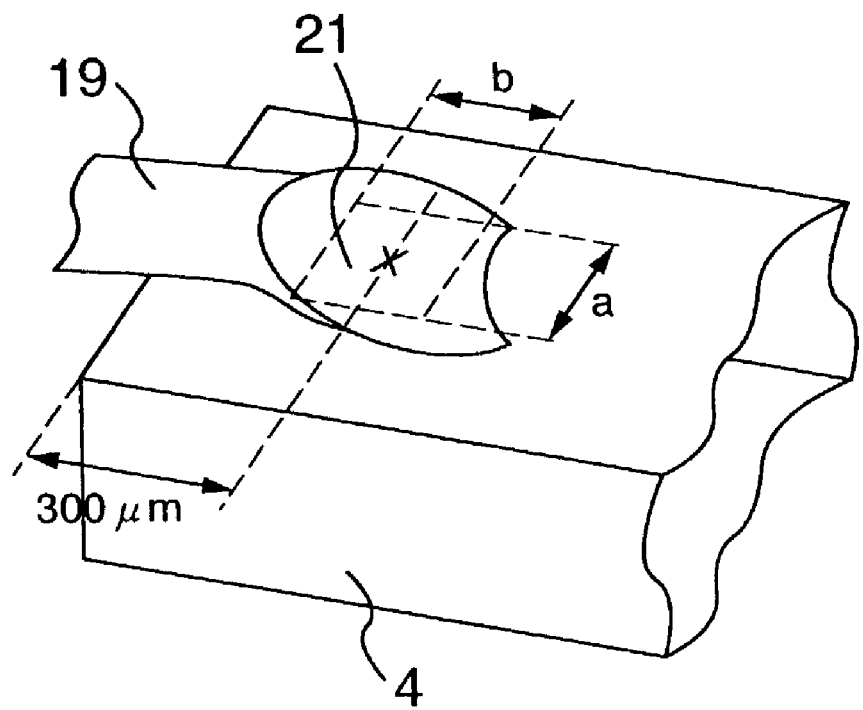
FIG. 19 is a perspective view of the adhered 20 portion of the wire bonding onto the surface of the Pd plating.

FIG. 12 is a cross sectional view along a line A-B of the enlarged view of the lead frame 7, shown in FIG. 11. The palladium plating 1 is applied to the front end portion of the lead. A portion to be palladium plated maybe structured such that the wire bonding portion has the smallest possible area to be spot plated. At the time of plating, the plating is performed by masking the portions other than the back surface of the lead frame 7 and the front end portion of the lead in accordance with an electrolytic plating. Accordingly, the plating is applied in a thickness direction in addition to the minimum amount necessary of plating on the surface of the front end of the inner lead, which will be described below. A description will be given of the case in which the wire bonding is performed with respect to the minimum plating area necessary by using the Au wire 19 which has a wire diameter of 30 μm, and a minimum necessary area 21 of the spot plating is about 75% of the area a×b of the wire adhered portion expressed by an adhered width a and an adhered length b, as shown in FIG. 19. In accordance with the present embodiment, both of the values a and b are set to be at least 90 μm, and the position of the minimum necessary area 21 is set so that the center thereof is arranged at 300 μm from the front end of the lead frame.

Further, a so-called tab descent for positioning the die pad 2 below the surface of the inner lead 4 by deforming the suspending lead 3 is performed. This is because the difference of resin charging speed between the upper and lower portions of the chip is reduced at the time of charging the resin, whereby a vibration can be prevented.

Figure 13:
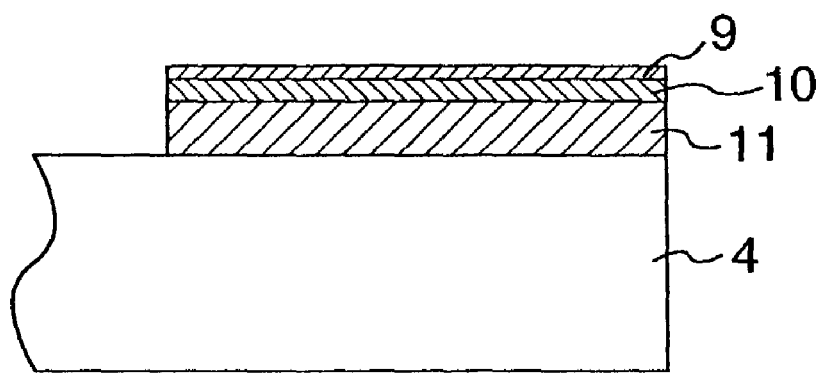
FIG. 13 is a cross sectional view showing details of a Pd plating in the front end of an inner lead.

FIG. 13 shows a structure of a palladium plating in the front end portion of the inner lead in accordance with the present embodiment. The palladium plating is constituted by three layers, and is structured such that a Ni plating 11 is first applied to the inner lead 4 as a ground plating, a palladium plating 10 is applied thereon, and an Au flash plating 9 is finally applied in order to improve a corrosion resistance. In accordance with the present embodiment, the particular thicknesses of the respective layers are set such that the thickness of the inner lead is 150 μm, the thickness of the Ni plating is 1.0 μm, the thickness of the palladium plating is 0.15 μm and the thickness of the Au flash plating is about 1 nm.

Figure 14:
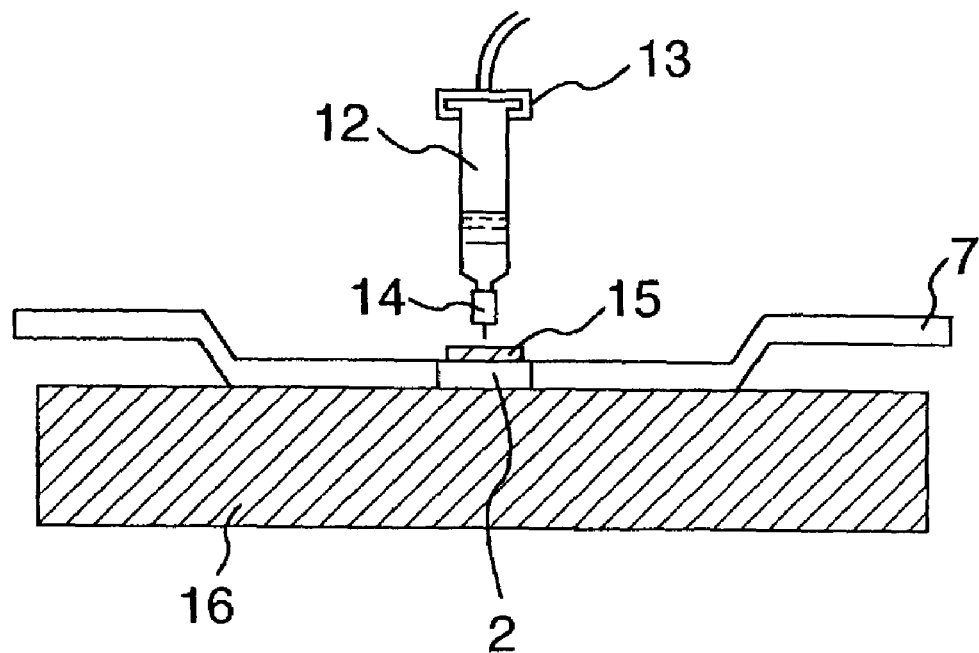
FIG. 14 is a schematic view showing an adhesive material application in a die bonding process using a frame in accordance with the present invention.
Figure 15:
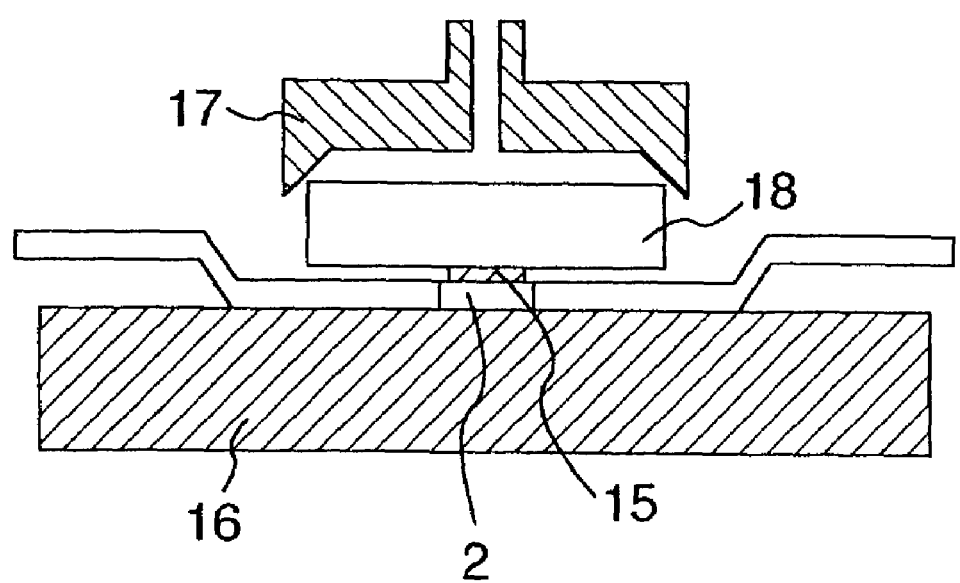
FIG. 15 is a schematic view showing a chip mounting in the die bonding process using the frame in accordance with the present invention.

A description will be given of the die bonding process with reference to FIG. 14. FIG. 14 is a cross sectional view along a line C-D in FIG. 11. The lead frame 7, after descending the tab, is mounted on a stage 16 and is brought into contact with a lower 10 surface of the die pad 2. An adhesive material 15 for die bonding is adhered onto an upper surface of the die pad by positioning a dispenser 13 which has a syringe 12 receiving the adhesive material 15 above the die pad. In this case, the adhesive material 15 employs a conductive paste (an organic resin containing Ag powders and carbons) for a semiconductor device having a small consumed power. Characteristics required for the die bonding material are: a solder wetting property with respect to a coated film of the semiconductor device and the lead frame 7, a thermal fatigue property of a solder due to the temperature difference between the semiconductor device time and the unused semiconductor device unused time and the like in addition to a good heat transmitting property. The conductive paste is effective in the view mentioned above. Further, since the object of the present invention is to reduce Pb, a metal solder mainly composed of Pb, which is generally used in a power device, is not used. However, this does not mean that no metal solder is used, and a Pb-free solder can actually be used. Regarding this, in the case of another representative invention which does not take the Pb-free into consideration, it is a matter of course that a metal solder mainly composed of Pb may be employed. The next step will be described with reference to FIG. 15. After moving a semiconductor chip 18 above the lead frame to which the adhesive material 15 is adhered by a collet 17, the chip is adhered to a chip adhering position. A cross sectional shape of the collet 17 is formed in a quadrangular pyramid, as shown in FIG. 15, and the collet 17 and the semiconductor chip 18 are closely attached to the collet 17 in accordance with a vacuum suction.

Figure 16:
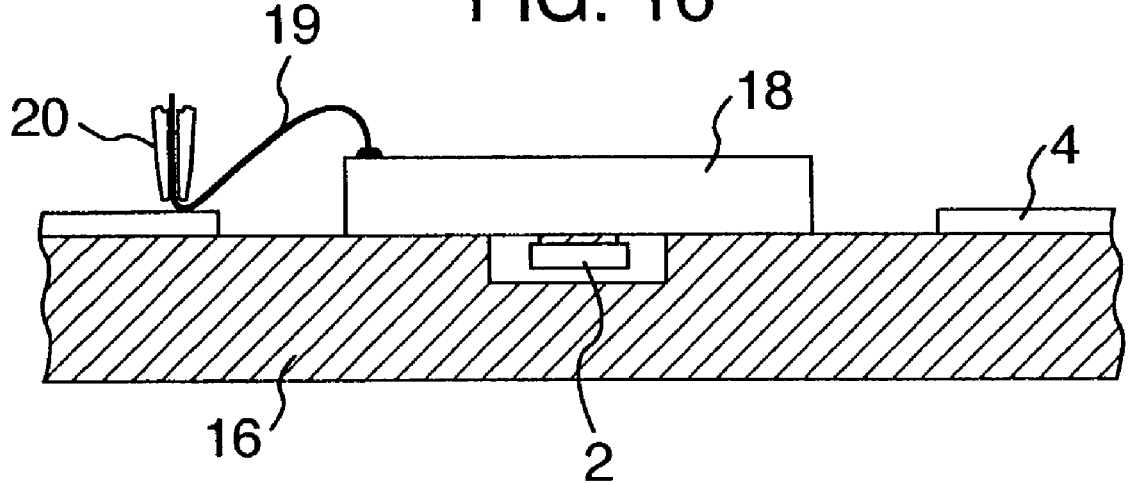
FIG. 16 is a schematic view showing a wire bonding process using the frame in accordance with the present invention.
Figure 17:
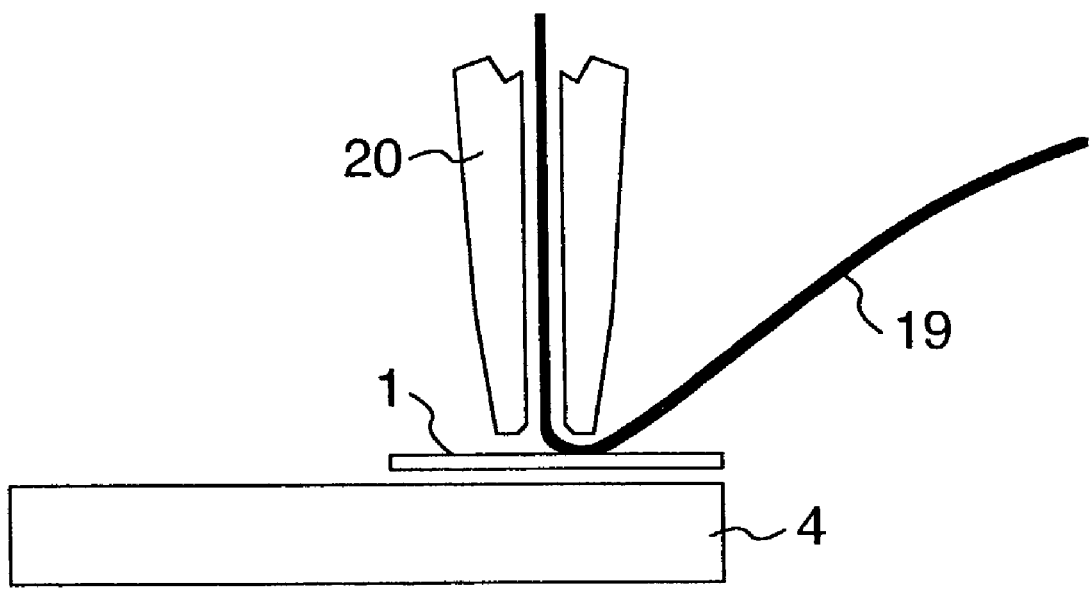
FIG. 17 is an enlarged view showing a Pd plating portion in the die bonding process using the frame in accordance with the present invention.
Figure 18:
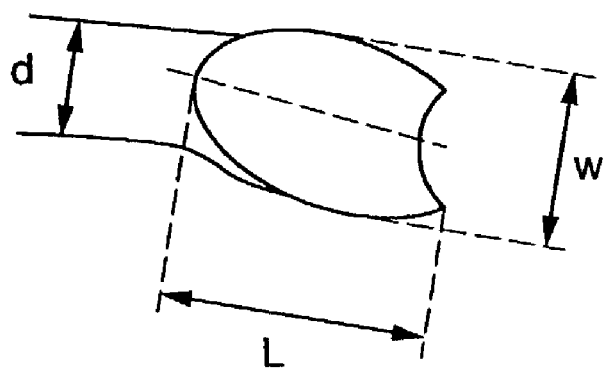
FIG. 18 is a schematic view showing the shape of an Au wire adhered portion at the time of wire bonding onto the surface of the Pd plating.

A description will be given of the wire bonding process with reference to FIG. 16. After the die bonding process, a lower surface of the chip 18 and a lower surface of the inner lead 4 are fixed to the stage 16. A portion in which the die pad 2, such as a notch or the like, is received is previously provided in the stage 16. After fixing, the capillary 20 is bonded onto the inner lead 4 from the pad on the chip 18. FIG. 17 is an enlarged view of a wire bonding portion. FIG. 18 is a schematic view of the shape of the adhered portion after wire bonding. In the case of the present invention, the wire diameter d is 30 μm, the adhered width W is 105 μm at the maximum, and the adhered length is 105 μm at the maximum. It is apparent from the result of an estimation performed by the inventors that a good adhered state can be obtained by setting a relation among L, W, and d so as to satisfy the formulas $1.5 \leq W/d \leq 3.5$ and $1.5 \leq L/d \leq 3.5$.

Figure 20:
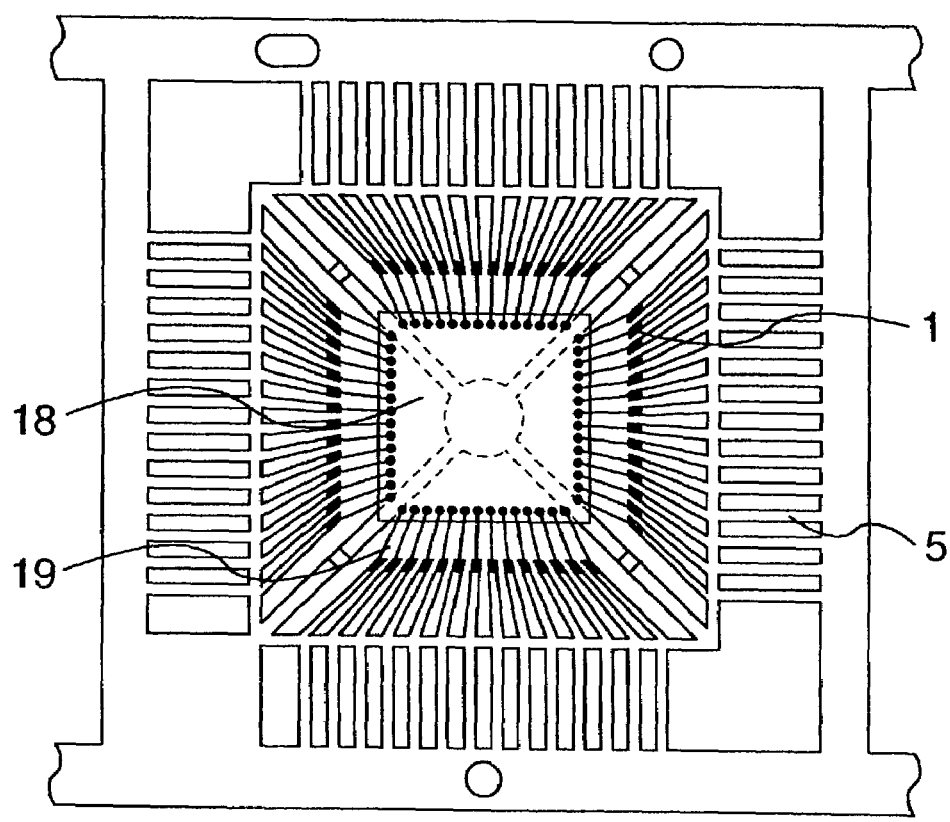
FIG. 20 is an enlarged plan view of a lead frame corresponding to one embodiment in accordance with the present invention after the wire bonding is completed.
Figure 21:
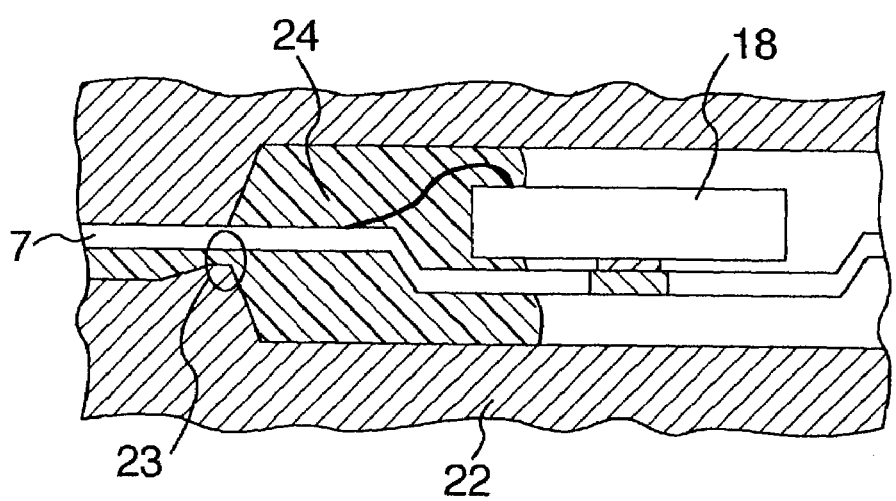
FIG. 21 is a cross sectional view of a resin molding process using the frame in accordance with the present invention.

The lead frame 7 obtained after the wire bonding process mentioned above is completed, as shown in FIG. 20, and a resin molding is performed next in the molding process. In the molding process, the lead frame 7 is held between molding metal molds 22, and a resin 24 is poured from a resin charging port 23. In the present embodiment, the time for pouring is structured such that the charging time becomes 10 seconds. At the time of pouring, it is necessary that the resin is poured at the same speed between the upper and lower portions of the lead frame 2. This is because a vibrating width of the lead frame 7 is set to be as small as possible at the time of molding and the stress applied to the wire 19 is reduced so as to prevent the wire from being disconnected.

Figure 22:
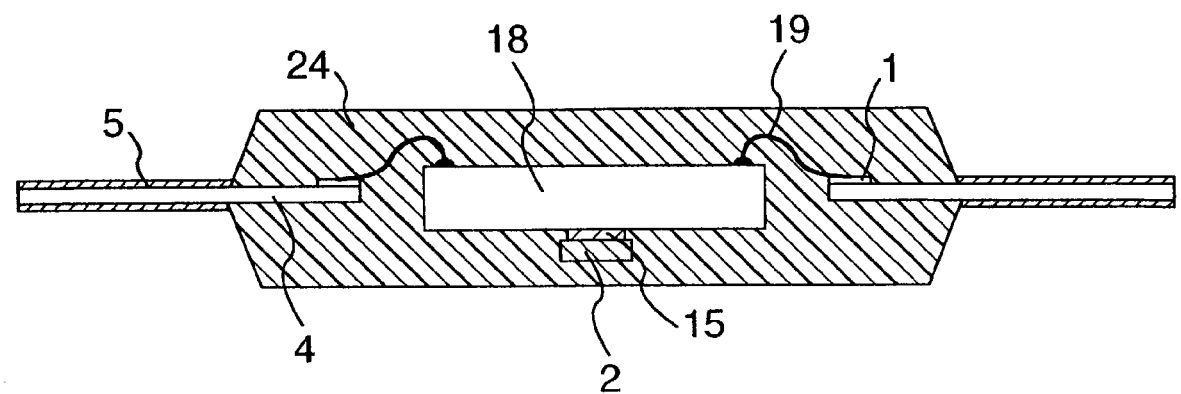
FIG. 22 is a cross sectional view after the plating of an outer lead using the frame in accordance with the present invention.

FIG. 22 shows a state in which the outer plating is applied to the outer lead 5 after molding the resin, and the outer plating is completed. The metal used for the outer plating in the present embodiment is an alloy obtained by adding Cu and/or Bi to the Sn—Ag system metal. This is because Pb reduction is realized and a reflow mounting having a high reflow temperature is supposed. Accordingly, it is a matter of course that it is possible to employ an alloy among Zn, In, Sb and Sn or an Sn system alloy in addition to the alloy mentioned above. In the case of the reflow mounting, a bonding cream solder includes a structure having a different mounting temperature such as an Sn—Ag system, an Sn—Zn system, an Sn—Bi system, and the like. In the current state, the Sn—Ag system metal has a melting point higher than the melting point of the Pb containing solder. However, in the other embodiment, the outer plating uses a lead system solder. This is because in the case of paying attention to the fact that the bonding strength between the inner lead 4 and the wire 19 is increased by applying the palladium plating to the inner lead 4, it is not necessary to limit the outer plating to the lead system solder.

Figure 23:
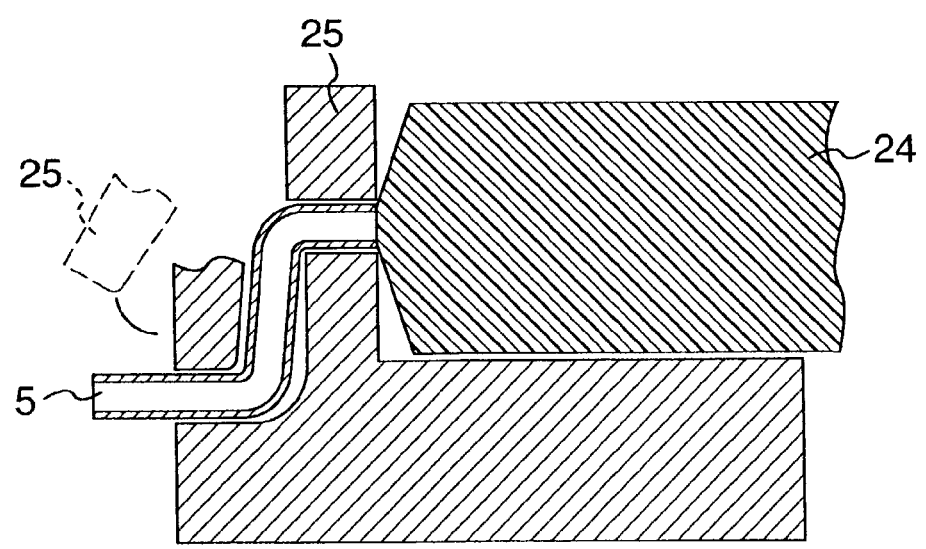
FIG. 23 is a schematic view showing a bending process using the frame in accordance with the present invention.
Figure 24:
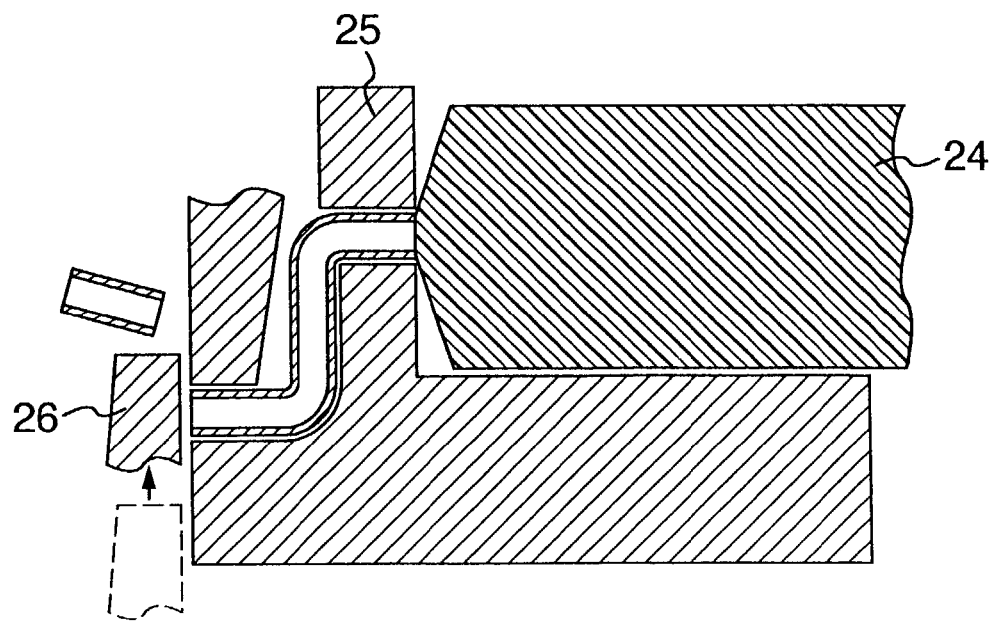
FIG. 24 is a schematic view showing a lead front end aligning process using the frame in accordance with the present invention.

After the outer plating is completed, there is a process of forming the outer lead 5. At first, as shown in FIG. 23, the resin molding body is held and fixed at a root portion of the outer lead 5, and the outer lead 5 is formed by a punch 25. After forming, the front end portion of the outer lead 5 is cut and formed by moving a die 26 from a lower portion, as shown in FIG. 24.

Figure 25:
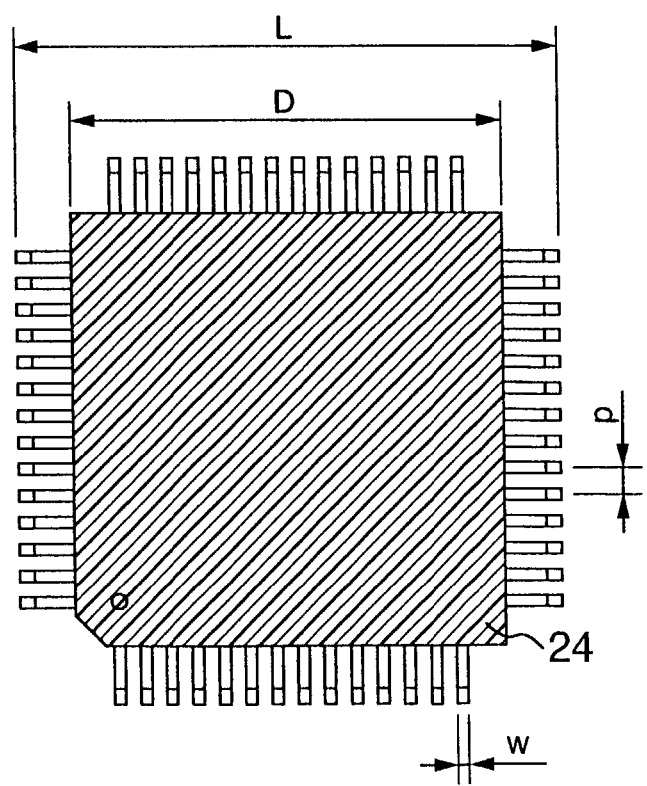
FIG. 25 is a top elevational view of the completed product of a package using the frame in accordance with the present invention.
Figure 26:
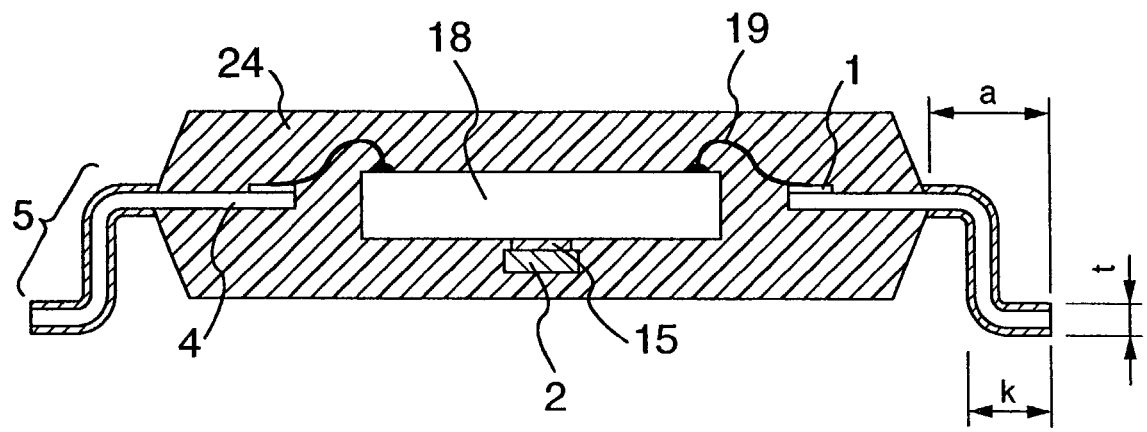
FIG. 26 is a cross sectional view along a line E-F of the completed product of the package using the frame in accordance with the present invention.
Figure 27:
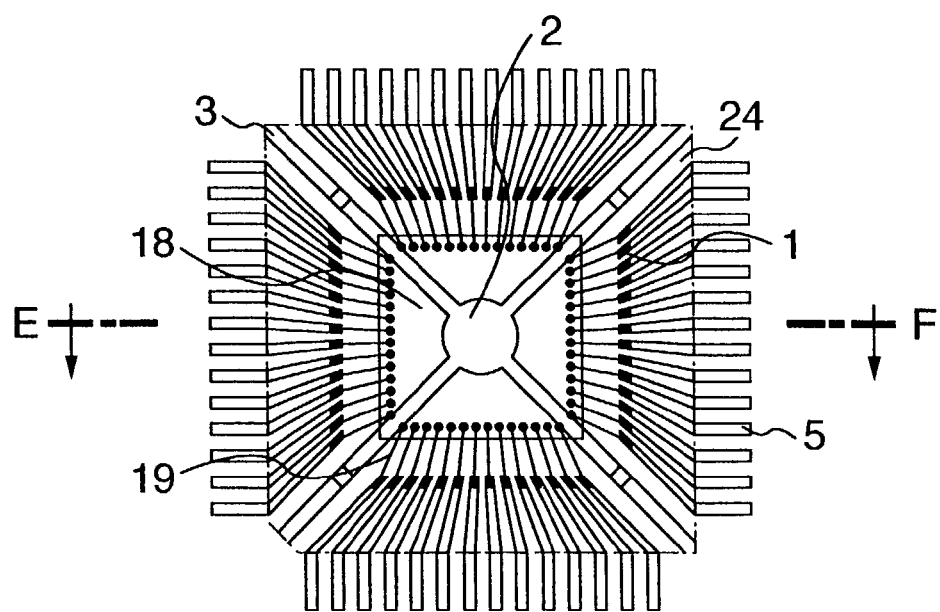
FIG. 27 is a perspective view of the completed product of the package using the frame in accordance with the present invention.

FIG. 25 is a schematic view of a completed 25 product in the present embodiment, FIG. 27 is a perspective view of the schematic view, and FIG. 26 is a cross sectional view along a line E-F in FIG. 27. The number of pins is 208, however, the reduced number of pins are illustrated in the drawings in order to avoid confusion. The shape of the resin molding body is obtained by beveling one corner and cutting a sign so as to secure the directivity of the package at the time of handling for mounting. In the completed product in the present embodiment, a size D of the resin molding body is 28 mm square, an outer size of the semiconductor package including the outer lead 5 is 30.6±0.2 mm, and the height is 3.56 mm at the maximum. Further, a pitch p of the lead is 0.5 mm, a width w of each of the leads is 0.2 mm, and a thickness t is 0.15 mm. A length a in a horizontal direction between the resin molding body and the front end of the outer lead is 1.3 mm, and a length k of the front end of the bent outer lead is 0.5 mm.

Figure 28:
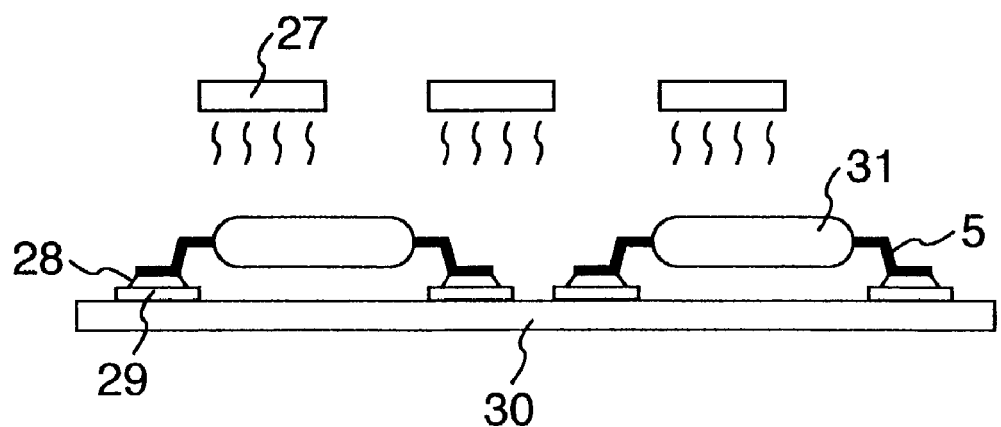
FIG. 28 is a schematic view showing a structure in which the package in accordance with the present invention is mounted on a substrate.
Figure 29:
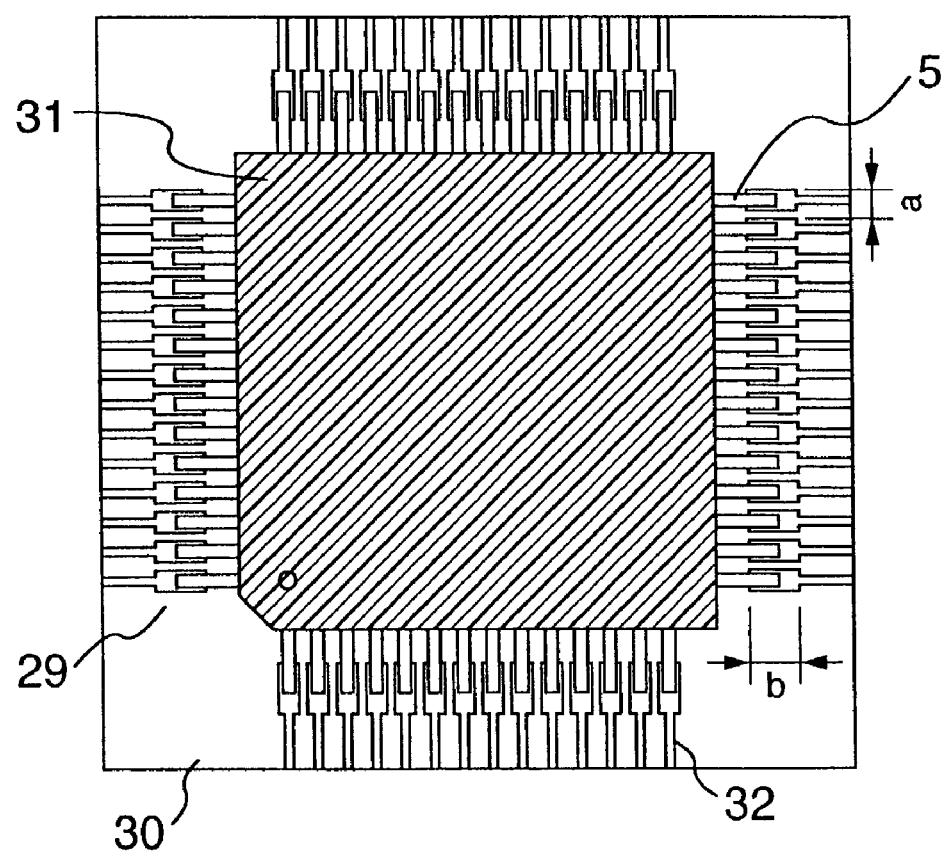
FIG. 29 is a top elevational view of the mounting substrate after the package in accordance with the present invention is mounted.

A description will be given of the process of mounting on a printed circuit board with reference to FIGS. 28 and 29. A solder paste 28 is applied onto a foot print 29 greater than the mounting surface in the front end of the outer lead 5. The mounting operation is performed by arranging a package 31 from the above after application and applying heat. The reflowing methods include a vapor phase reflow, an air reflow, an infrared rays reflow, and the like. In the embodiment, the reflow temperature is 255° C., and is 20° C. higher than the reflow temperature 235° C. of the normal Sn—Pb system solder. This is because it is possible to correspond to the fact that the melting point of the solder is high. Further, in the particular sizes of the foot print 29 on the printed circuit board 30, a width a is 0.20 to 0.25 mm and a length b is 1.3 mm.

This is because within the range of the size, a little shift of the position of the package generated while it is being arranged can be self-aligned by the reflow, so that there no problem caused by the shift of the mounting position.

Figure 30:
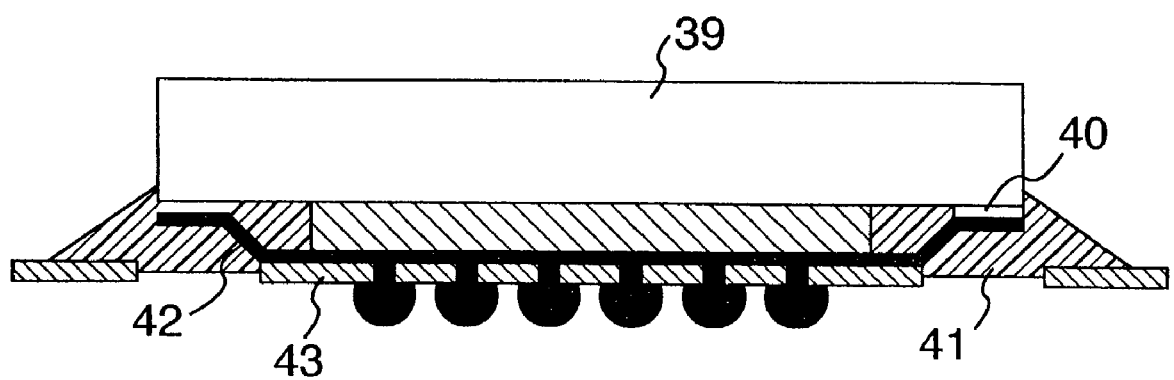
FIG. 30 is a schematic cross sectional view of a Fan-In type CSP of a peripheral pad structure.

In the embodiment mentioned above, a description is given of the case in which the present invention is employed for the purpose of manufacturing QFP. However, the present invention can be applied to a surface mounting type package such as QFN, QFJ, or the like without being limited to QFP, and further, the present invention can be applied to general packages having wire connecting portions such as a small outline non-leaded package in which a pad arranged in the middle of a chip is connected to a lead by a wire. Further, in accordance with the embodiment, the structure is made in order to improve the connecting strength of the portion in which the wire corresponding to the connecting member is adhered and connected to the inner lead corresponding to the member to be connected. However, the connecting member is not limited to the wire, and the member to be connected is not limited to the lead. For example, the present invention can be applied to the case of applying the Pd plating to a pad 40 corresponding to a portion for adhering, and connecting a lead corresponding to a connecting member 42 to a semiconductor chip 39 in a chip size package or the like, which employs an insulative member such as a polyimide tape 43 or the like for a base material and is mounted on a substrate by a solder ball, as shown in a schematic cross sectional view in FIG. 30. That is, the present invention can be generally applied to the improvement of connecting property and reliability in the connecting portion in the semiconductor device.

A description will be briefly given of effects obtained by the representative invention among the inventions disclosed by the present application.

In accordance with the present invention, it is possible to provide an LSI package corresponding to the lead-free, in particular, an LSI package using the lead-free alternate solder having a melting point higher than that of the Pb system solder, and it is possible to improve an assembling yield and reliability. Further, it is possible to provide an LSI package corresponding to the narrow wire caused by the increase of pins in the package or the increase of size thereof and the chip shrink, and it is possible to improve an assembling yield and reliability.

What is claimed is:

1. A method of manufacturing a semiconductor integrated circuit device comprising the steps of:
    (a) preparing a lead frame having a die pad, a plurality of leads arranged around the die pad, and a palladium plated layer formed in a part of each of the plurality of leads;
    (b) mounting a semiconductor chip over the die pad;
    (c) electrically connecting a plurality of electrodes of the semiconductor chip with the plurality of leads through a plurality of wires, respectively, by using a capillary; and
    (d) sealing the semiconductor chip, the plurality of wires, and a part of the plurality of leads with a resin,
    wherein one end portion of each of the plurality of wires is connected with the palladium layer at an adhered portion of each of the wire which is formed at the one end portion of each of the plurality of wires by applying an adhering force with the capillary; and
    wherein the adhering force of the capillary is set so as to secure at least 10 μm or more of a thickness of the adhered portion of each of the wires.

2. The method of manufacturing the semiconductor integrated circuit device according to claim 1, wherein a diameter of each of the plurality of wires is equal to or less than 30 μm.

3. A method of manufacturing a semiconductor integrated circuit device according to claim 1, wherein the wires are connected to the palladium layer at the adhered portions by a Pb-free solder.

4. A method of manufacturing a semiconductor integrated circuit device according to claim 2, wherein the wires are connected to the palladium layer at the adhered portions by a Pb-free solder.

5. A method of manufacturing a semiconductor integrated circuit device according to claim 3, wherein the melting point of the Pb-free solder is higher than the melting point of a solder mainly composed of Pb.

6. A method of manufacturing a semiconductor integrated circuit device according to claim 4, wherein the melting point of the Pb-free solder is higher than the melting point of a solder mainly composed of Pb.

7. The method of manufacturing the semiconductor integrated circuit device according to claim 1, wherein in the adhered portion, a thickness of a portion located in an end portion of the capillary is 10 μm or more.

8. A method of manufacturing a semiconductor integrated circuit device comprising the steps of:
    (a) preparing a lead frame having a die pad, a plurality of leads arranged around the die pad, and a palladium plated layer formed in a part of each of the plurality of leads;
    (b) mounting a semiconductor chip over the die pad;
    (c) electrically connecting a plurality of electrodes of the semiconductor chip with the plurality of leads through a plurality of wires, respectively, by using a capillary; and
    (d) sealing the semiconductor chip, the plurality of wires, and a part of the plurality of leads with a resin,
    wherein the wires are connected to the palladium layer at the adhered portions by a Pb-free solder,
    wherein the melting point of the Pb-free solder is higher than the melting point of a solder mainly composed of Pb,
    wherein one end portion of each of the plurality of wires is connected with the palladium layer at an adhered portion of each of the wire which is formed at the one end portion of each of the plurality of wires by applying an adhering force with the capillary; and
    wherein the adhering force of the capillary is set so as to secure at least 10 μm or more of a thickness of the adhered portion of each of the wires to reduce the likelihood of breakage of the wires at the adhered portion during a solder reflow operation of said Pb-free solder.

9. A method of manufacturing the semiconductor integrated circuit device according to claim 8, wherein in the adhered portion, a thickness of a portion located in an end portion of the capillary is 10 μm or more.

* * * * *